United States Patent [19]
Sasayama

[11] Patent Number: 5,701,542
[45] Date of Patent: Dec. 23, 1997

[54] AUTOMATIC DEVELOPING APPARATUS FOR PHOTOSENSITIVE LITHOGRAPHIC PRINTING PLATES

[75] Inventor: Hiroyuki Sasayama, Shizuoka, Japan

[73] Assignee: Fuji Photo Film Co., Ltd., Kanagawa, Japan

[21] Appl. No.: 723,277

[22] Filed: Sep. 30, 1996

[30] Foreign Application Priority Data

Sep. 29, 1995 [JP] Japan ............... P.HEI.7-253472

[51] Int. Cl.$^6$ .................. G03D 3/02; G03D 3/13
[52] U.S. Cl. .................. 396/578; 396/622; 396/627
[58] Field of Search ..................... 396/604, 626, 396/627

[56] References Cited

U.S. PATENT DOCUMENTS

| | | | |
|---|---|---|---|
| 4,422,152 | 12/1983 | Kaufmann | 396/570 |
| 4,882,246 | 11/1989 | Ohba et al. | 430/30 |
| 5,053,796 | 10/1991 | Ohba | 396/626 |
| 5,217,848 | 6/1993 | Uehara et al. | 396/626 |
| 5,479,233 | 12/1995 | Takekoshi et al. | 396/626 |

FOREIGN PATENT DOCUMENTS 5-8823  2/1993  Japan .

*Primary Examiner*—D. Rutledge
*Attorney, Agent, or Firm*—Sughrue, Mion, Zinn, Macpeak & Seas, PLLC

[57] ABSTRACT

An automatic developing apparatus for photosensitive lithographic printing plates, includes a development vessel storing a plate developer and a replenishing apparatus for replenishing a predetermined amount of development replenisher in accordance with an electric conductance of the plate developer. The replenishing apparatus includes: an electric conductance sensor detecting the electric conductance of the plate developer; a delivery device delivering the development replenisher into the development vessel; a timer detecting an elapsed time from replenishment of the development replenisher; and a control device for setting a reference electric conductance and for controlling the delivery device to replenish the development replenisher when the detected electric conductance has fallen below the set reference electric conductance. The control device calculates a carbon dioxide exhaustion replenisher ratio for replenishing the development replenisher in accordance with the elapsed time and the predetermined amount of the development replenisher. The automatic developing apparatus is capable of maintaining the activity of the plate developer in a good condition over a long period of time by the ratio between the plate processing exhaustion and the carbon dioxide exhaustion.

10 Claims, 3 Drawing Sheets

AUTOMATIC DEVELOPING APPARATUS FOR PHOTOSENSITIVE LITHOGRAPHIC PRINTING PLATES

BACKGROUND OF THE INVENTION

The present invention relates generally to an automatic developing apparatus for photosensitive lithographic printing plates in which the automatic developing apparatus includes a replenishing apparatus for replenishing a certain amount of development replenisher which has been set in advance when an electric conductance of a plate developer within a development vessel has become less than a reference electric conductance, and more particularly to an improvement of the automatic developing apparatus intended to make it possible to set a more proper reference electric conductance.

A plate developer for use in the development of a photosensitive lithographic printing plate (which may be hereinafter abbreviated as a PS plate) is deteriorated with the progress of development processing (plate processing) (which is sometimes called exhaustion since its activity is lowered), or alternatively degraded by the fact that carbon dioxide existing in air dissolves thereinto due to a contact with the air. Thus, advancement of the deterioration beyond a predetermined level may prevent a proper development processing from being performed.

It is therefore known to make a recovery from the deterioration by timely replenishing a development replenisher.

Methods of discriminating the degree of deterioration of the plate developer which have hitherto been approached include a method of replenishing a proper amount of development replenisher every fixed throughput while measuring the throughput of the PS plates for example, the processed area of the plates, or the number of the plates which have been processed) and a method of replenishing a proper amount of development replenisher every fixed elapsed time while measuring the operation time. However, the method of replenishing the development replenisher based on the throughput of the plates may give rise to a problem that the complication of the apparatus is inevitable for the implementation of the proper replenishment since it needs not merely an accurate measurement of the processed area of the PS plate but also a measurement of coating thickness of the photosensitive layer deposited on the PS plate and a judgment on whether it is a one-side plate or a both-side plate.

A change in characteristics caused by the deterioration of the plate developer has thus been researched and it has been proved that the deterioration attributable to the processing of the plates results in a lowered electric conductance of the plate developer. As a result, a research has been recently made on a method in which the electric conductance of the plate developer is monitored to replenish a fixed amount of development replenisher which has been set in advance when the electric conductance has become less than a reference electric conductance. As disclosed in Examined Japanese Patent Publication No. Hei. 5-8823 by way of example, a technique has also been developed in which the reference electric conductance for determining the timing to replenish the development replenisher is increased in response to the throughput of the plates.

The above-described method in which the electric conductance of the plate developer is monitored to replenish the development replenisher when the electric conductance has become less than a reference electric conductance is capable of reducing the measurement processing required for the determination of the timing to replenish the development replenisher, which will contribute to a simplification of the apparatus configuration of the automatic developing apparatus and will make it possible to allow for a compensation for so-called deterioration with time which is a deterioration attributable to the solution thereinto of carbon dioxide existing in air.

For example, the reference electric conductance for the control of the replenishment has been found based on the results of analyzing the degree of place processing exhaustion and the degree of carbon dioxide exhaustion from data sampled during an actual test operation of the automatic developing apparatus for a specified period of time, and the thus found reference electric conductance has been stored in the apparatus.

Incidentally, the exhaustion of the plate developer attributable to the processing of the PS plate (hereinafter, referred to as plate processing exhaustion) is increased accordingly as the throughput per unit time (processing frequency) of the PS plate is larger, but is decreased accordingly as the processing frequency is smaller. On the contrary, it is envisaged that the exhaustion of the plate developer attributable to the solution thereinto of carbon dioxide (hereinafter, referred to as carbon dioxide exhaustion) is determined by the amount of the carbon dioxide in air with which the plate developer contacts per unit time and that it may change depending on the environment under which the apparatus is disposed and the configuration of the apparatus which affects the amount of carbon dioxide in air with which the plate developer contacts per unit time, but that it is unchanged for unit time.

In short, the ratio between the plate processing exhaustion and the carbon dioxide exhaustion varies depending on the processing frequency of the PS plate.

On the other hand, it is clear from the experiments that there exists a difference between the reference electric conductance at the time of only the plate processing exhaustion and the reference electric conductance at the time of only the carbon dioxide exhaustion, and hence it can be seen that the reference electric conductance varies once the ratio between the plate processing exhaustion and the carbon dioxide exhaustion is changed. Therefore, even though the reference electric conductance at respective throughput has been experimentally found in advance, the reference electric conductance will result in improper value providing that the processing frequency at the actual operation differs from the forecast value.

If the control of replenishment is executed on the basis of the improper reference electric conductance, the replenishment of the development replenisher earlier than the ideal timing to replenish the development replenisher would result in excessive activity of the plate developer whereas the replenishment of the development replenisher later than the ideal timing to replenish the development replenisher would result in insufficient activity of the plate developer, which anyway making it impossible to carry out proper development processing.

Thus, upon the setting of the reference electric conductance for determining the timing to replenish the development replenisher, there arises at least a need to allow for the provision of a more accurate ratio between the plate processing exhaustion and the carbon dioxide exhaustion.

Nevertheless, the method of replenishing the development replenisher which has been hitherto developed including the technique described in Examined Japanese Patent Publication No. Hei. 5-8823 does not have a device for automatically setting the reference electric conductance, taking into consideration the ratio between the plate processing exhaustion and the carbon dioxide exhaustion.

Furthermore, the data sampling during the test operation is not only greatly time-consuming but also must be performed individually for each user having different processing frequency of the plate processing and having different environment under which the apparatus is disposed. Hence, in fact, it was difficult to properly set the reference electric conductance to maintain the activity of the plate developer in a good condition on m long-term basis without spending a great deal of time and labor, which improvement has been desired.

SUMMARY OF THE INVENTION

It is therefore the object of the present invention to obviate the above problems and to provide an automatic developing apparatus for photosensitive lithographic printing plates capable of, during the operation of the automatic developing apparatus, automatically setting at a more proper value the reference electric conductance for determining the timing to replenish the development replenisher, by timely taking into consideration the ratio between the plate processing exhaustion and the carbon dioxide exhaustion, without any need to previously execute the troublesome work such as data sampling by test operation and its analysis, the development replenisher can be replenished in a suitable manner, making it possible to maintain the activity of the plate developer in a good condition over a long period of time.

In the first aspect of the present invention, the above object is achieved by an automatic developing apparatus for photosensitive lithographic printing plates which includes a development vessel storing a plate developer and a replenishing apparatus for replenishing a predetermined amount $V_h$ of development replenisher in accordance with an electric conductance of the plate developer, the replenishing apparatus including: an electric conductance sensor detecting the electric conductance of the plate developer; a delivery device delivering the development replenisher into the development vessel; a timer detecting an elapsed time T from replenishment of the development replenisher; and a control device for setting a reference electric conductance $\sigma_{comp}$ and for controlling the delivery device to replenish the development replenisher when the electric conductance detected by the electric conductance sensor has fallen below the set reference electric conductance, in which the control device calculates a carbon dioxide exhaustion replenisher ratio $f_c$ for replenishing the development replenisher in accordance with the elapsed time T and the predetermined amount $V_h$ of the development replenisher.

In the second aspect of the present invention, the above object of the present invention is also accomplished by an automatic developing apparatus for photosensitive lithographic printing plates which includes a development vessel storing a plate developer and a replenishing apparatus for replenishing a predetermined amount $V_h$ of development replenisher in accordance with an electric conductance of the plate developer, the replenishing apparatus including: an electric conductance sensor detecting the electric conductance of the plate developer; a delivery device delivering the development replenisher into the development vessel; a measuring device measuring a throughput per unit time S of the photosensitive lithographic printing plates; and a control device for setting a reference electric conductance $\sigma_{comp}$ and for controlling the delivery device to replenish the development replenisher when the electric conductance detected by the electric conductance sensor has fallen below the set reference electric conductance, in which the control device calculates a carbon dioxide exhaustion replenisher ratio $f_c$ for replenishing the development replenisher from a difference between the predetermined amount $V_h$ of the development replenisher and a preset amount $V_a$ of the development replenisher which is required for a plate processing per unit time which is calculated by the throughput per unit time S.

According to the above configuration of the present invention, when the automatic developing apparatus is actuated, the control device of the replenishing apparatus incorporated into the automatic developing apparatus calculates a carbon dioxide exhaustion replenisher ratio $f_c$ which is a ratio of the amount of the carbon dioxide exhaustion replenisher to a certain amount $V_h$ of the development replenisher to be replenished every replenishment processing, from a difference between the amount $V_a$ of the development replenisher which has been previously set and is necessary for the plate processing per unit time which is calculated by use of the elapsed time T taken until the replenishment of the development replenisher is required or by use of the throughput S per unit time, and the certain amount $V_h$ of the development replenisher to be replenished every replenishment processing, and corrects the electric conductance of the plate developer within the development vessel by using the carbon dioxide exhaustion replenisher replacement rate $X_{Cn}$ which has been calculated on the basis of the carbon dioxide exhaustion replenishment ratio $f_c$ and using the plate processing exhaustion replenisher replacement rate $X_{Bn}$, thereby automatically setting the reference electric conductance $\sigma_{com}$.

As a result, during the operation of the automatic developing apparatus, there can be automatically set at a more appropriate value the reference electric conductance $\sigma_{comp}$ for determining the timing to replenish the development replenisher, by timely taking into consideration the ratio between the plate processing exhaustion and the carbon dioxide exhaustion. Moreover, without any need to previously execute the troublesome work such as data sampling by test operation and its analysis, the development replenisher can be replenished in a suitable manner, thereby making it possible to maintain the activity of the plate developer in a good condition over a long period of time.

It is to be noted that "a difference between the amount $V_s$ of the development replenisher which has been previously set and is necessary for the plate processing per unit time which is calculated by use of the throughput S per unit time, and the certain amount $V_h$ of the development replenisher to be replenished every replenishment processing" defines a difference, ratio, etc., between both.

DETAILED DESCRIPTION OF THE PREFERRED EMBODIMENTS

Figure 1:
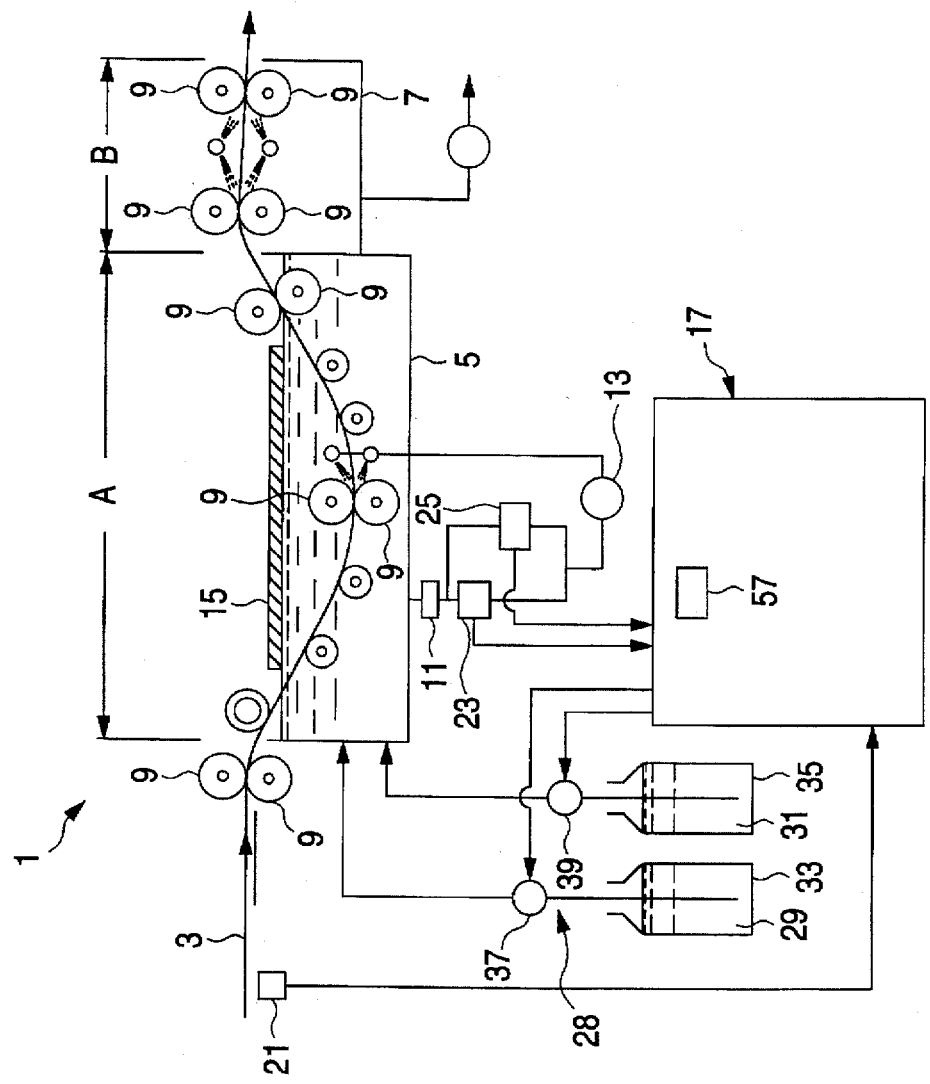
FIG. 1 is a schematic configurational view of an automatic developing apparatus in accordance with an embodiment of the present invention.
Figure 2:
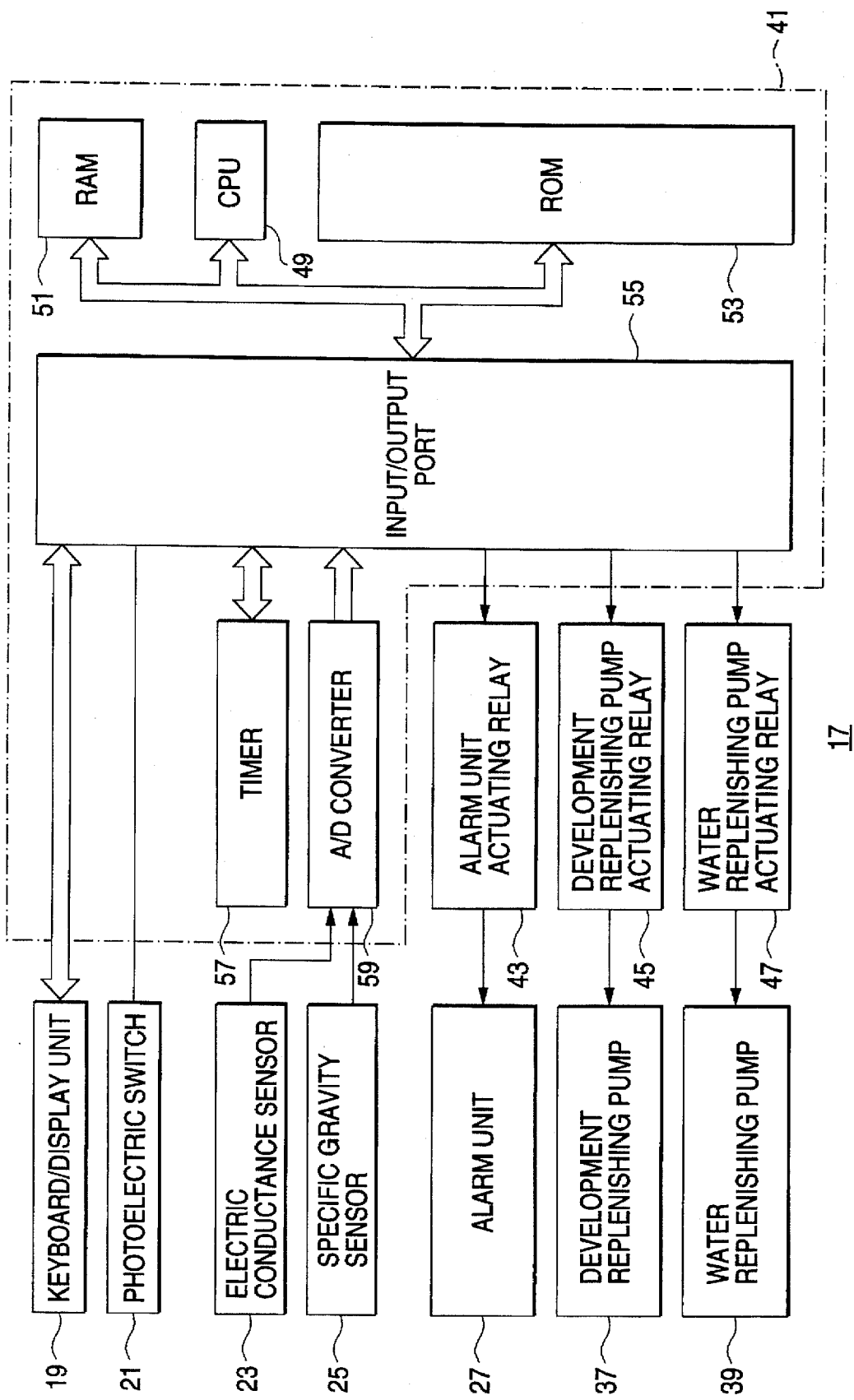
FIG. 2 is a block diagram showing a configuration of a replenishing apparatus incorporated into the automatic developing apparatus in accordance with an embodiment of the present invention.
Figure 3:
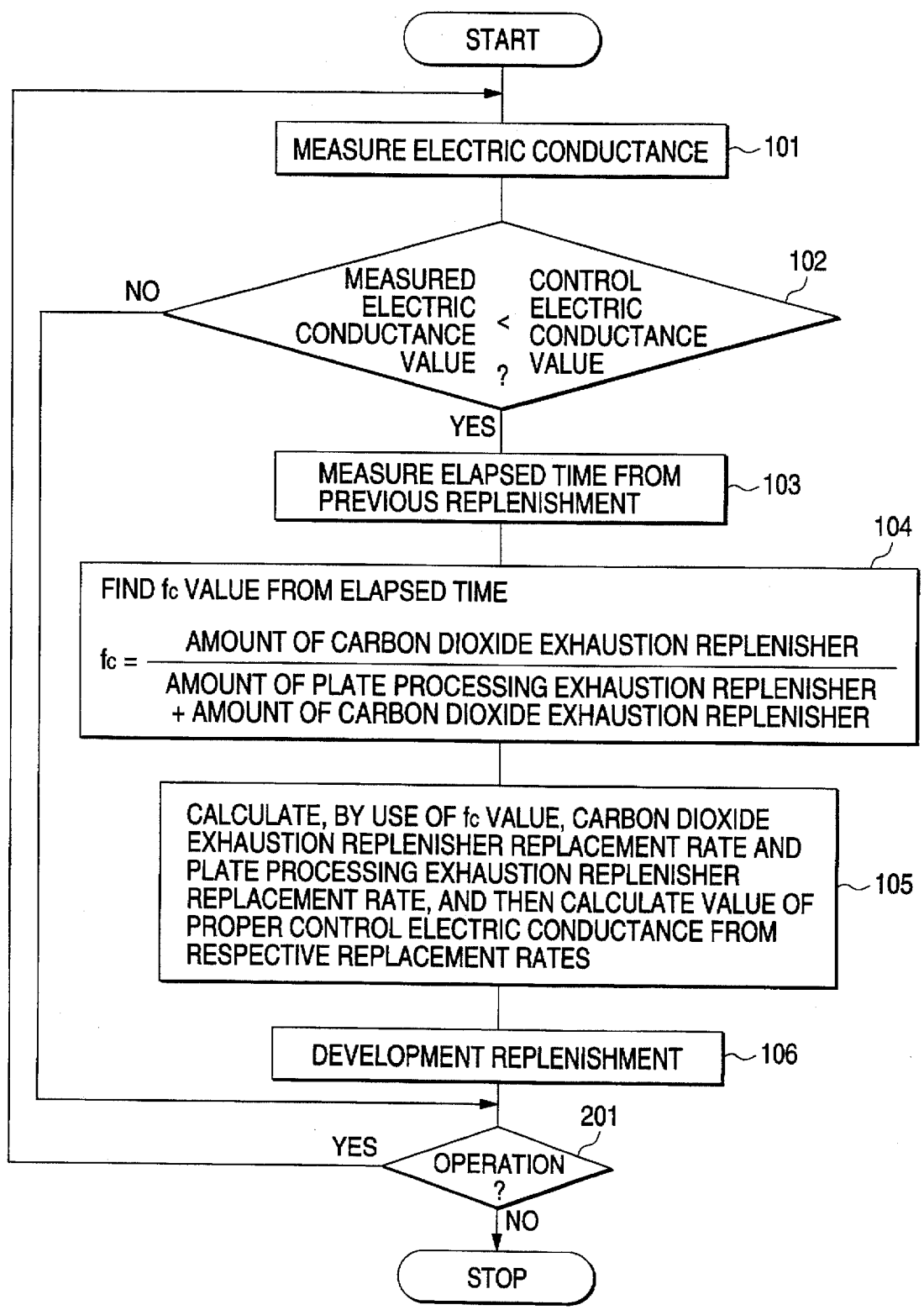
FIG. 3 is a flow chart showing the control action performed by a control device of the replenishing apparatus incorporated into the automatic developing apparatus in accordance with an embodiment of the present invention.

FIGS. 1 to 3 illustrate an embodiment of an automatic developing apparatus for photosensitive lithographic printing plates according to the present invention. As shown in FIG. 1, an automatic developing apparatus 1 according to the embodiment of the present invention includes a development vessel 5 for containing therein a plate developer for a presensitized printing plate 3 to carry out a development processing, and a rinse vessel 7 for rinsing the presensitized printing plate 3 after development. The presensitized printing plate 3 after exposure is conveyed and immersed into the plate developer within the development vessel 5 by conveyance rollers 9 to carry out a development processing. The presensitized printing plate 3 after development is successively conveyed to the rinse vessel 7 to be subjected to a jet of rinse to carry out rinsing.

The plate developer within the development vessel 5 is jetted against the presensitized printing plate 3 while being filtrated through a filter 11 and circulated by a pump 13, to thereby enhance a liquid exchange rate on the surface to be processed of the presensitized printing plate 3. As in the present embodiment, it is preferable to provide a floating cover for covering the surface of the plate developer within the development vessel 5 so as to prevent the plate developer from coming into contact with air as much as possible. The development vessel 5 may also include a cover for closing the upper space in an air-tight manner. Furthermore, a rotary brush serving to scrub the surface of the plate may be provided as a development promoting device.

A replenishing plate 17 illustrated in detail in FIG. 2 is connected to the development vessel 5. This replenishing apparatus serves to replenish a predetermined amount of development replenisher which has been set in advance, when the electric conductance of the plate developer within the development vessel 5 has become less than a reference electric conductance $\sigma_{comp}$ which has been set by a controller 41 as will be described later. The replenishing apparatus 17 includes a keyboard/display unit 19, a photoelectric switch 21 serving as a plate processed area measuring device for measuring the throughput per unit time of the presensitized printing plate 3, an electric conductance sensor 23 for measuring the electric conductance of the plate developer within the development vessel 5, a specific gravity sensor 25 for measuring the specific gravity of the plate developer, an alarm unit 27 for issuing alarm when some abnormality has been found in the plate developer, a delivery device 28 for delivering the development replenisher or diluting water to the development vessel 5, and the controller 41 serving as a control device for controlling the action of the alarm unit 27 and the delivery device 28, by setting the reference electric conductance $\sigma_{comp}$ on the basis of signals from the keyboard/display unit 19, the photoelectric switch 21, the electric conductance sensor 23 and the specific gravity sensor 25.

In this case, the delivery device 28 includes replenishment tanks 33 and 35 filled respectively with development replenisher 29 and diluting water 31, a development replenishing pump 37 for supplying the development replenisher 29 into the development vessel 5, and a water replenishing pump 39 for supplying the diluting water 31 into the development vessel 5, the action of the development replenishing pump 37 and the water replenishing pump 39 being controlled by the controller 41.

It is to be appreciated that the alarm unit 27, the development replenishing pump 37 and the water replenishing pump 39 are connected by way of respectively actuating relays 43, 45, and 47 to the controller 41.

On the contrary, the controller 41 includes a CPU 49 serving as a central processing unit for executing a predetermined operational processing in conformity with a program and for providing a control signal to the respective components, a first memory (RAM) 51 for storing values which have been calculated by the CPU 49 and values which have been detected by the above-described sensors, a second memory (ROM) 53 for storing a program for actuating the CPU 49 and for storing fundamental data necessary for the processing to replenish the replenisher 29 and 31, an input/output port 55 for implementing the transmission/reception of data between the CPU 49 and the respective components, a timer 57 for detecting elapsed time T taken from the first replenishment to the second replenishment, and an analog-to-digital converter 59. The controller 41 serves to control the action of the delivery device 28 in such a manner that the development replenishing liquid 29 is replenished as soon as the electric conductance of the plate developer within the development vessel 5 falls below the reference electric conductance which has been calculated.

In the controller 41 described above, the replenishment of the development replenisher 29 is processed in accordance with a procedure as shown in FIG. 3.

Simultaneously with the start of operation of the automatic developing apparatus 1, the electric conductance sensor 23 measures an electric conductance within the development vessel 5, the electric conductance which has been detected by the electric conductance sensor 23 being compared in its magnitude with the reference electric conductance $\sigma_{comp}$ which has been written to the first memory 51 in advance (steps 101 and 102).

In regard to the reference electric conductance $\sigma_{comp}$ which is to be set in the first memory 51 at the first start of operation of the automatic developing apparatus 1, an optimum value thereof is automatically selected from among initial reference values which have been previously stored in the second memory 53, by instructing, through an input of the keyboard, the amount of the plate developer to be introduced into the development vessel 5, the type of the presensitized printing plate 3 to be processed, and so forth.

Then, in the step 102, if the electric conductance which has been detected by the electric conductance sensor 23 is larger than the reference electric conductance $\sigma_{comp}$ which has been written in advance to the first memory 51, then it is judged that the plate developer within the development vessel 5 has a sufficient activity, and unless an operation stop button is depressed, the procedure returns to the step 101 to repeat the measurement of the electric conductance (step 201).

On the contrary, in the step 102, if the electric conductance which has been detected by the electric conductance sensor 23 is less than the reference electric conductance $\sigma_{comp}$ which has been written in advance to the first memory 51, then it is judged that the plate developer within the development vessel 5 has been rather deteriorated and does not have a necessary and sufficient activity, and then the elapsed time T after the most recent replenishment processing of the development replenisher is derived from a timer 57 (step 103). Then, a carbon dioxide exhaustion replenisher ratio $f_c$ is calculated from this elapsed time T (unit: hour) and from a certain amount $V_h$ (unit: cc) of the development replenisher to be replenished every replenishment processing in accordance with the following expression (1) (step 104). The carbon dioxide exhaustion replenisher ratio $f_c$ is a ratio of the amount of carbon dioxide exhaustion replenisher compensating for the carbon dioxide exhaustion of the plate developer to the above-described amount $V_h$ of the development replenisher,:

$$f_c = (V_{con} \cdot T)/V_h \tag{1}$$

where the above $V_{con}$ represents the amount of a carbon dioxide exhaustion replenisher per unit time under operation of the apparatus and is a certain value to be determined by the type of apparatus, the environment under which the apparatus is disposed, and so forth.

Then, from the carbon dioxide exhaustion replenisher ratio $f_c$ found in accordance with the expression (1) and from the amount V of the plate developer which has been already introduced into the development vessel 5 and from the amount $V_h$ of the development replenisher to be newly replenished there are calculated, on the basis of the following expressions (2) and (3), a carbon dioxide exhaustion replenisher replacement rate $X_{cn}$ which is the rate of replacement of the carbon dioxide exhaustion replenisher and a plate processing exhaustion replenisher replacement rate $X_{Bn}$ as the rate of replacement of the amount of the plate processing exhaustion replenisher which is the amount of the development replenisher to compensate for the plate processing exhaustion which is an exhaustion of the plate developer with respect to the throughput of the photosensitive lithographic printing plate. Furthermore, a new reference electric conductance $\sigma_{comp}$ is established by correcting the electric conductance of the plate developer within the development vessel 5 found by the electric conductance sensor in accordance with the expression (4) by use of the replacement rates $X_{cn}$ and $X_{Bn}$ (step 105).

$$X_{Cn} = (X_{Cn-1} \cdot V + V_h \cdot f_c)/(V+V_h) \tag{2}$$

$$X_{Bn} = \{X_{Bn-1} \cdot V + V_h(1-f_c)\}/(V+V_h) \tag{3}$$

$$\sigma_{comp} = X_{Cn}(\sigma_C - \sigma_M) + X_{Bn}(\sigma_B - E_M) = \sigma_M \tag{4}$$

where in the expressions (2) to (4), the suffix n is the number (positive integer) of repetition of the replenishment processing, $\sigma_c$ is a reference electric conductance at the time of only the carbon dioxide exhaustion, $\sigma_M$ is the reference electric conductance of the starting liquid, and $\sigma_B$ is a reference electric conductance at the time of only the plate processing exhaustion.

Then, the reference electric conductance $\sigma_{comp}$ which has been calculated in the step 105 is newly recorded in the first memory 51, and based on that reference electric conductance $\sigma_{comp}$, the replenishment processing of the development replenisher 29 and the diluting liquid 31 is carried out, after which the procedure returns to the step 101 (step 106).

By virtue of the above-described replenishment of the development replenisher 29 and the diluting liquid 31, there can be automatically set at a more appropriate value the reference electric conductance $\sigma_{comp}$ for determining the timing to replenish the development replenisher 29 and the diluting liquid 31, by timely taking into consideration the ratio between the plate processing exhaustion and the carbon dioxide exhaustion during the operation of the automatic development apparatus 1. Moreover, without any need to previously execute the troublesome work such as data sampling by test operation and its analysis, the development replenisher 29 and the diluting liquid 31 can be replenished in a suitable manner, thereby making it possible to maintain the activity of the plate developer in a better condition over a long period of time.

It is to be appreciated in the above-described step 104 that since the replenishing apparatus 17 according to the embodiment includes the photoelectric switch 21 for measuring the throughput per unit time of the photosensitive lithographic printing plate, the above $f_c$ may also be calculated in accordance with the following expression (1'), instead of the above expression (1), from a throughput S per unit time which has been calculated by use of the operation time of the photoelectric switch 21 and the conveyance speed and an average width of the photosensitive lithographic printing plate which has been set in advance, and from a certain amount $V_h$ of the development replenisher to be replenished every replenishment processing.

$$f_c = 1 - (V_s \cdot S/V_h) \tag{1'}$$

where the above $V_s$ is the amount of replenishment per unit throughput which is necessary for the plate processing per unit time, the $V_s$ having been experimentally found in advance.

It is to be appreciated that the above $f_c$ can be calculated using a difference between $V_s \cdot S$ and $V_h$, other than using the ratio between $V_s \cdot S$ and $V_h$ as described above.

According to the automatic developing apparatus for photosensitive lithographic printing plates of the present invention, when the automatic developing apparatus is activated, the control device of the replenishing apparatus incorporated in the automatic developing apparatus calculates a carbon dioxide exhaustion replenisher ratio $f_c$ which is a ratio of the amount of the carbon dioxide exhaustion replenisher to a certain amount $V_h$ of the development replenisher to be replenished every replenishment processing, from a difference between the amount $V_s$ of the development replenisher which has been previously set and is necessary for the plate processing per unit time which is calculated by use of the elapsed time T taken until the replenishment of the development replenisher ie required or by use of the throughput S per unit time, and the certain amount $V_h$ of the development replenisher to be replenished every replenishment processing, and corrects the electric conductance of the plate developer within the development vessel by using the carbon dioxide exhaustion replenisher replacement rate $X_{Cn}$ which has been calculated on the basis of the carbon dioxide exhaustion replenishment ratio $f_c$ and using the plate processing exhaustion replenisher replacement rate $X_{Bn}$, thereby automatically setting the reference electric conductance $\sigma_{comp}$.

As a result, during the operation of the automatic developing apparatus, there can be automatically set at a more appropriate value the reference electric conductance $\sigma_{comp}$ for determining the timing to replenish the development replenisher, by timely taking into consideration the ratio between the plate processing exhaustion and the carbon dioxide exhaustion. Moreover, without any need to previously execute the troublesome work such as data sampling by test operation and its analysis, the development replenisher can be replenished in a suitable manner, thereby making it possible to maintain the activity of the plate developer in a good condition over a long period of time.

What is claimed is:

1. An automatic developing apparatus for photosensitive lithographic printing plates, comprising a development vessel storing a plate developer and a replenishing apparatus for replenishing a predetermined amount of development replenisher in accordance with an electric conductance of the plate developer, the replenishing apparatus comprising:

an electric conductance sensor detecting the electric conductance of the plate developer;

a delivery device delivering the development replenisher into the development vessel;

a timer detecting an elapsed time from replenishment of the development replenisher; and a control device for setting a reference electric conductance and for controlling the delivery device to replenish the development replenisher when the electric conductance detected by the electric conductance sensor has fallen below the set reference electric conductance, the control device calculating a carbon dioxide exhaustion replenisher ratio for replenishing the development replenisher in accordance with the elapsed time and the predetermined amount of the development replenisher.

2. The automatic developing apparatus of claim 1, wherein the carbon dioxide exhaustion replenisher ratio is a ratio of an amount of carbon dioxide exhaustion replenisher compensating for a carbon dioxide exhaustion of the plate developer to the predetermined amount of the development replenisher.

3. The automatic developing apparatus of claim 1, wherein the control device calculates a first replacement rate for the carbon dioxide exhaustion replenisher and a second replacement rate for a plate processing exhaustion replenisher which is an amount of the development replenisher compensating for a plate processing exhaustion with respect to a throughput of the photosensitive lithographic printing plates, based on the carbon dioxide exhaustion replenisher ratio and an amount of the plate developer which has been already introduced into the development vessel, and the predetermined amount of the development replenisher.

4. The automatic developing apparatus of claim 3, wherein the control device resets the reference electric conductance correctively using the first and second replacement rates.

5. The automatic developing apparatus of claim 1, wherein the reference electric conductance is an electric conductance obtained when a sensitivity of the plate developer is proper.

6. An automatic developing apparatus for photosensitive lithographic printing plates, comprising a development vessel storing a plate developer and a replenishing apparatus for replenishing a predetermined amount of development replenisher in accordance with an electric conductance of the plate developer, the replenishing apparatus comprising:

an electric conductance sensor detecting the electric conductance of the plate developer;

a delivery device delivering the development replenisher into the development vessel;

a measuring device measuring a throughput per unit time of the photosensitive lithographic printing plates; and a control device for setting a reference electric conductance and for controlling the delivery device to replenish the development replenisher when the electric conductance detected by the electric conductance sensor has fallen below the set reference electric conductance, the control device calculating a carbon dioxide exhaustion replenisher ratio for replenishing the development replenisher from a difference between the predetermined amount of the development replenisher and a preset amount of the development replenisher which is required for a plate processing per unit time which is calculated by the throughput per unit time.

7. The automatic developing apparatus of claim 6, wherein the carbon dioxide exhaustion replenisher ratio is a ratio of an amount of carbon dioxide exhaustion replenisher compensating for a carbon dioxide exhaustion of the plate developer to the predetermined amount of the development replenisher.

8. The automatic developing apparatus of claim 6, wherein the control device calculates a first replacement rate for the carbon dioxide exhaustion replenisher and a second replacement rate for a plate processing exhaustion replenisher which is an amount of the development replenisher compensating for a plate processing exhaustion with respect to a throughput of the photosensitive lithographic printing plates, based on the carbon dioxide exhaustion replenisher ratio and an amount of the plate developer which has been already introduced into the development vessel, and the predetermined amount of the development replenisher.

9. The automatic developing apparatus of claim 8, wherein the control device resets the reference electric conductance correctively using the first and second replacement rates and the throughput per unit time.

10. The automatic developing apparatus of claim 6, wherein the reference electric conductance is an electric conductance obtained when a sensitivity of the plate developer is proper.

* * * * *